United States Patent [19]

Toyomaki

[11] Patent Number: 5,008,675
[45] Date of Patent: Apr. 16, 1991

[54] DIGITAL TO ANALOG CONVERTER USING PULSE WIDTH MODULATOR FOR INDEPENDENTLY SETTING EDGE POSITION

[75] Inventor: Kazuya Toyomaki, Zama, Japan

[73] Assignee: Victor Company of Japan, Ltd., Yokohama, Japan

[21] Appl. No.: 414,278

[22] Filed: Sep. 29, 1989

[30] Foreign Application Priority Data

Sep. 29, 1988 [JP] Japan ................................. 63-245697

[51] Int. Cl.[5] ............................................ H03M 1/82
[52] U.S. Cl. .................................... 341/152; 341/144
[58] Field of Search ....................... 341/143, 144, 152; 375/22; 329/312; 328/119, 164

[56] References Cited

U.S. PATENT DOCUMENTS

| | | | |
|---|---|---|---|
| 3,624,529 | 11/1971 | Gebelein, Jr. | 375/22 |
| 4,389,637 | 6/1983 | Rzeszewski | 341/152 |
| 4,542,371 | 9/1985 | Uchikoshi | 341/152 |
| 4,591,832 | 5/1986 | Fling et al. | 341/144 |
| 4,636,773 | 1/1987 | Lewis et al. | 341/127 |

FOREIGN PATENT DOCUMENTS

| | | | |
|---|---|---|---|
| 63-176020 | 7/1988 | Japan | 341/144 |
| 63-246928 | 10/1988 | Japan | 341/144 |

*Primary Examiner*—A. D. Pellinen
*Assistant Examiner*—H. L. Williams

*Attorney, Agent, or Firm*—Fleit, Jacobson, Cohn, Price, Holman & Stern

[57] ABSTRACT

A PWM type D/A converter having a first PWM converter, a second PWM converter and an analog adder. The digital input signals are designated as odd and even numbered input signals and the reference timing points for outputting odd/even numbered input signal are designated as odd/even numbered reference timing points. The first PWM converter receive the digital input signal to output signal whose rising/falling timing point is set at the earlier/later timing, the larger the value of the odd/even numbered input signal relative to the odd/even numbered reference timing point and the pulse width is determined by the values of the odd numbered input signal and the next even numbered input signal. The second PWM converter receives the digital input signal to output signal whose rising/falling timing point is set at the later timing, the larger the value of the even/odd numbered input signal relative to the even/odd numbered reference timing point and the pulse width is determined by the value of the even numbered input signal and the next odd numbered input signal. In another aspect the second PWM converter receives the digital input signal to output signal whose rising/falling timing point is at the later the timing, the larger the value of the odd/even numbered input signal relative to the odd/even numbered reference timing point and the pulse width is determined by complementary values of the odd numbered input signal and the next even numbered input signal.

2 Claims, 10 Drawing Sheets

DIGITAL TO ANALOG CONVERTER USING PULSE WIDTH MODULATOR FOR INDEPENDENTLY SETTING EDGE POSITION

BACKGROUND OF THE INVENTION

The present invention relates to a PWM (Pulse Width Modulation) type D/A (digital-to-analog) converter used in demodulating, for example, a PCM (Pulse Code Modulation) audio signal.

In demodulation (D/A converting) a PCM audio signal by using a PWM type D/A converter (hereinafter called a PWM converter), it is necessary to modulate an audio signal into PWM waveforms symmetrical in time relative to certain timing point in order to avoid generating a phase error in a demodulated signal.

FIG. 1 shows the waveforms of output signals according to to a conventional PWM type D/A converter.

In FIG. 1, seven values from +3 to −3 are the values of digital input signals, T is the period (sample period) for input signals, and t is the period of a clock signal CK used for conversion. The resolution m of the conventional of PWM signals is given by:

$$m = T/(2t) - 1 \quad (1)$$

As seen from FIG. 1, since T/t=16, the resolution m becomes 7 from the equation (1). PWM signals corresponding to respective seven values +3 to −3 can therefore be obtained.

As described above, if a conventional PWM converter is used in demodulating PCM audio signals at high speed and with high resolution, it is necessary, as understood from the equation (1), to use a clock signal of very high frequency. The use of such a clock signal poses various problems such as an increase of unnecessary radiation which interferes other devices, and a difficulty in obtaining a stable oscillator element.

SUMMARY OF THE INVENTION

It is an object of the present invention to provide a PWM type D/A converter capable of lowering the frequency of a clock signal without changing the sample period of an input signal and resolution.

It is another object of the present invention to provide a PWM type D/A converter capable of obtaining a better resolution without changing the sample period of an input signal and the frequency of a clock signal.

According to the present invention there is provided PWM type D/A converter wherein digital input signals supplied to the converter at each predetermined input sample period are designated as odd and even numbered input signals alternately in the order of input, the reference timing point for outputting an odd numbered input signal is designated as an odd numbered reference timing point, and the reference timing point for outputting an even number is designated as an even numbered reference timing point, the PWM type D/A converter comprising a first PWM converter receiving the digital input signal for outputting an output signal (A) wherein the timing point when the output signal (A) rises from the low level to the high level is set at the earlier the timing, the larger the value of the odd numbered input signal relative to the odd numbered reference timing point, and the timing point when the output signal (A) falls from the high level to the low level is set at the later the timing, the larger the value of the even numbered input signal relative to the even numbered reference timing point, and wherein the pulse width from the rising point to the falling point of the output signal (A) is determined by the values of the odd numbered input signal and the next even numbered input signal; a second PWM converter receiving the digital input signal for outputting an output signal (B) wherein the timing point when said output signal (B) falls from the high level to the low level is set at the later the timing, the larger the value of the odd numbered input signal relative to the odd numbered reference timing point, and the timing point when said output signal (B) rises from the low level to the high level is set at the earlier the timing, the larger the value of the even numbered input signal relative to the even numbered reference timing point, and wherein the pulse width from the rising point to the falling point of the output signal (B) is determined by the values of the even numbered input signal and the next odd numbered input signal; and an analog adder for adding together the output signal (A) from the first PWM converter and the output signal (B) from the second PWM converter to output a sum signal (A+B); wherein an analog signal corresponding to the digital input signal is outputted from said analog adder.

According to the present invention, there is also provided PWM type D/A converter wherein digital input signals supplied to the converter at each predetermined input sample period are designated as odd and even numbered input signals alternately in the order of input, the reference timing point for outputting an odd numbered input signal is designated as an odd numbered reference timing point, and the reference timing point for outputting an even number is designated as an even numbered reference timing point, the PWM type D/A converter comprising a first PWM converter receiving the digital input signal for outputting an output signal (A) wherein the timing point when said output signal (A) rises from the low level to the high level is set at the earlier the timing, the larger the value of the odd numbered input signal relative to the odd numbered reference timing point, and the timing point when the output signal (A) falls from the high level to the low level is set at the later the timing, the larger the even numbered reference timing point, and wherein the pulse width from the rising point to the falling point of the output signal (A) is determined by the values of the odd numbered input signal and the next even numbered input signal; a second PWM converter receiving the digital input signal for outputting an output signal (C) wherein the timing point when the output signal (C) rises from the low level to the high level is set at the later the timing, the larger the value of the odd numbered input signal relative to the odd numbered reference timing point, and the timing point when said output signal (C) falls from the high level to the low level is set at the earlier the timing, the larger the value of the even numbered input signal relative to the even numbered reference timing point, and wherein the pulse width from the rising point to the falling point of said output signal (C) is determined by the complementary values of the values of the odd numbered input signal and the next even numbered input signal; and an analog subtracter for subtracting from each other the output signal (A) from the first PWM converter and the output signal (C) from the second PWM converter to output a difference signal (A−C) or (C−A); wherein an analog signal corresponding to said digital input signal is outputted from said analog subtracter.

According to the present invention, it is possible to reduce unnecessary radiation without changing the sample period of an input signal and resolution, by lowering the frequency of a clock signal. Since the frequency of the clock signal is lowered, a stable oscillator element can be used. It is also possible to convert at higher precision and obtain a better resolution without changing the sample period of an input signal and the frequency of a clock signal.

DETAILED DESCRIPTION OF THE PREFERRED EMBODIMENTS

Figure 2:
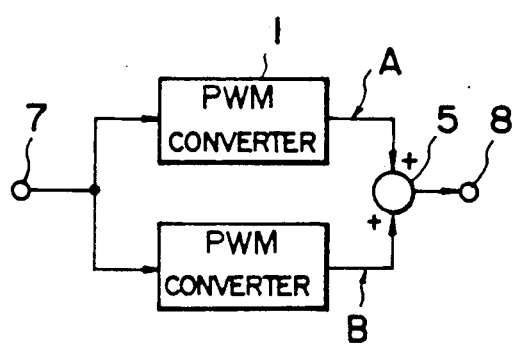
FIGS. 2 to 4 are block diagrams showing the first to third embodiments of the PWM type D/A converters according to the present invention.
Figure 3:
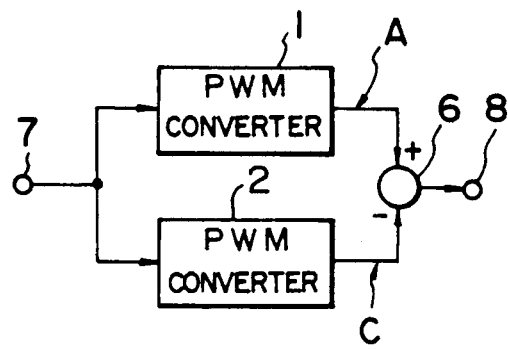
Figure 4:
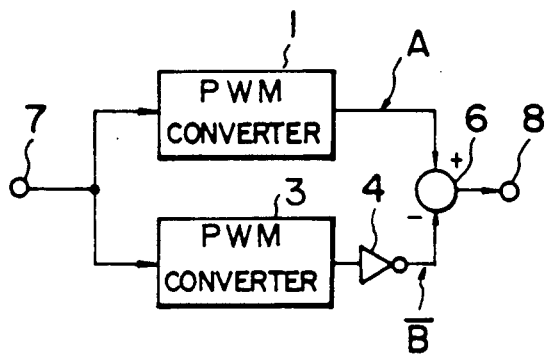

FIGS. 2 to 4 are block diagrams showing the first to third embodiments of the PWM type D/A converters (PWM converter) according to the present invention. In the following description, it is assumed that T/t=8. It is also assumed that digital input signals supplied to the PWM converter at each predetermined period (input sample period) are called odd and even numbered input signals alternately in the order of input, and that the reference timing point for outputting an odd numbered input signal is called an odd numbered reference timing point, and the reference timing point for outputting an even numbered is called an even numbered reference timing point.

Referring to FIG. 2 showing the first embodiment of this invention, a digital input signal applied to an input terminal 7 is D/A converted by a first PWM converter 1 into a PWM signal A, and at the same time D/A converted by a second PWM converter 2 into a PWM signal B. The PWM signals A and B are added together in an analog adder 5 and the added PWM signal (A+B) is outputted from an output terminal 8.

Figure 5:
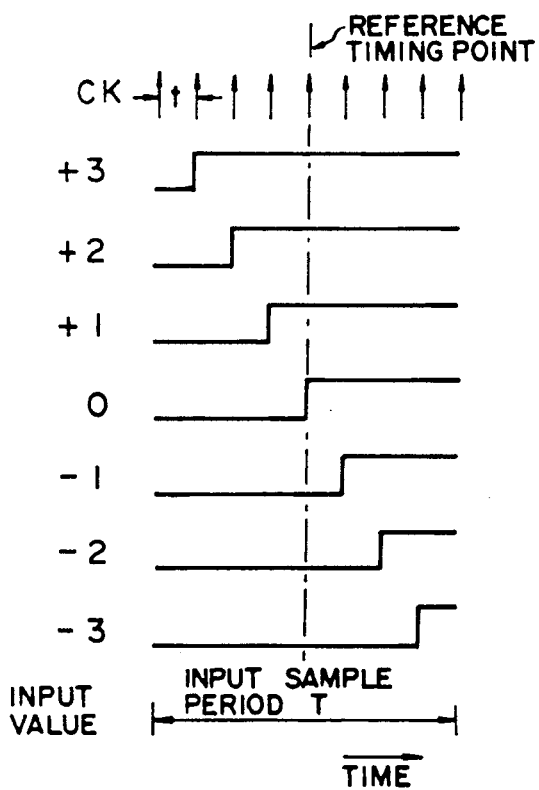
FIGS. 5 and 6 show the timings when the PWM signals are outputted, according to the present invention.

The PWM signal A is set so as to be outputted at the timings shown in FIG. 5 when the signals rise from a low level (L) to a high level (H) in synchronization with a clock signal CK, so that the earlier the timing, the larger the value of the odd numbered input signal relative to the odd numbered reference timing point.

The PWM signal B is set so as to be outputted at the timings shown in FIG. 6 when the signals fall from a high level (H) to a low level (L) in synchronization with the clock signal CK, namely at the later the timing, the larger the value of the odd numbered input signal relative to the odd numbered reference timing point.

Figure 7:
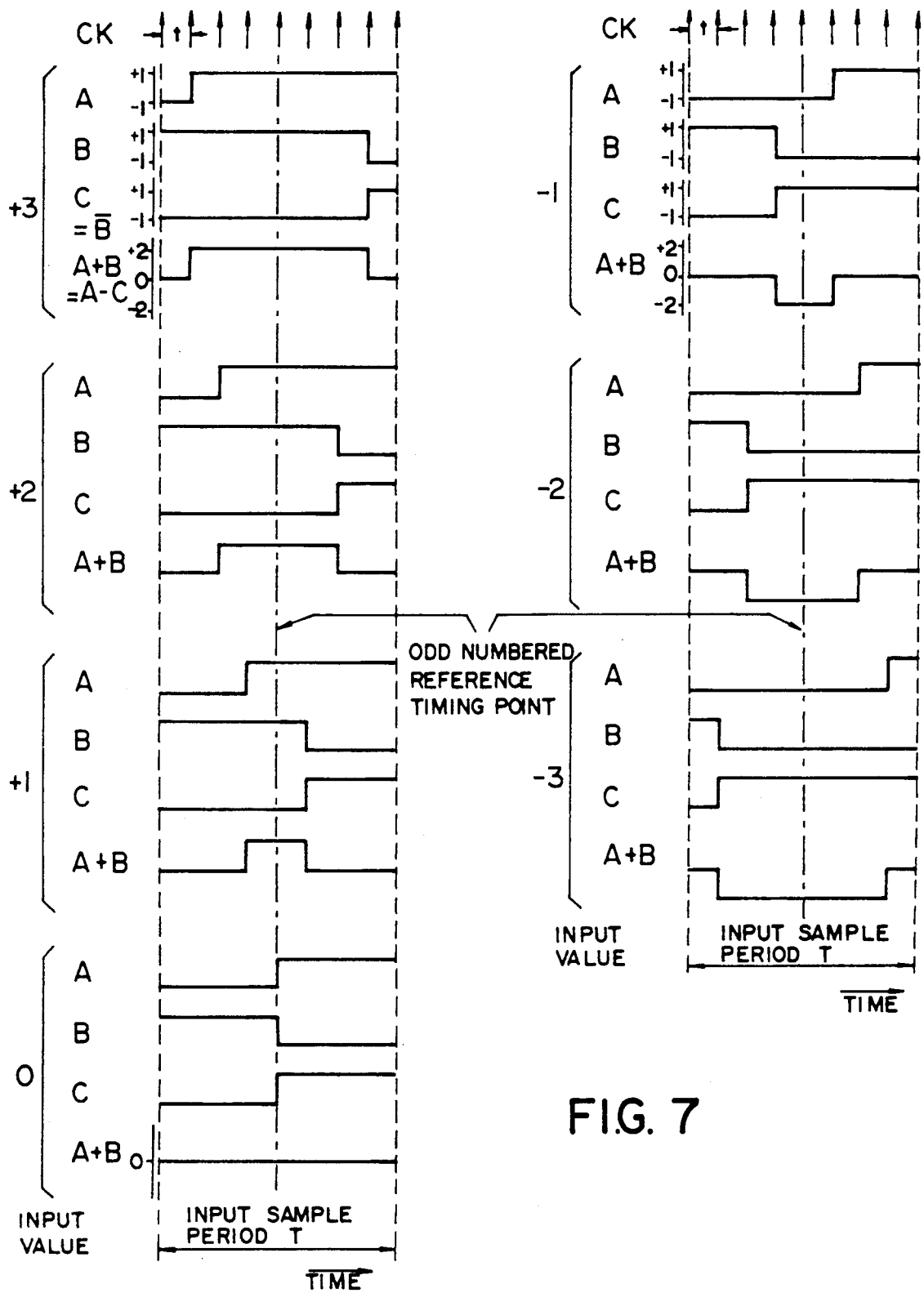
FIG. 7 shows the waveforms of the PWM signals for respective input signal values according to the present invention.

The PWM signals A, B, and (A+B) are shown in FIG. 7.

After the lapse of the predetermined period (input sample period), the PWM signal A is set so as to be outputted at the timings shown in FIG. 6 when the signals fall from a high level (H) to a low level (L), namely at the later the timing, the larger the value of the even numbered input signal relative to the even numbered reference timing point.

The PWM signal B is set so as to be outputted at the timings shown in FIG. 5 when the signals rise from a low level (L) to a high level (H), namely at the earlier the timing, the larger the value of the even numbered input signal relative to the even numbered reference timing point.

The PWM signal A (B) for respective values of the even numbered input signal has the waveform same as the PWM signal B (A) for respective values of the odd numbered input signal, whereas the PWM signal (A+B) is the same for both the odd and even numbered input signals.

As seen from the foregoing description, the pulse width from the rising point to the falling point of the PWM signal A is determined by the values of the odd numbered input signal and the next even numbered input signal. The pulse width from the rising point to the falling point of the PWM signal B is determined by the values of the even numbered input signal and the next odd numbered input signal.

Figure 8:
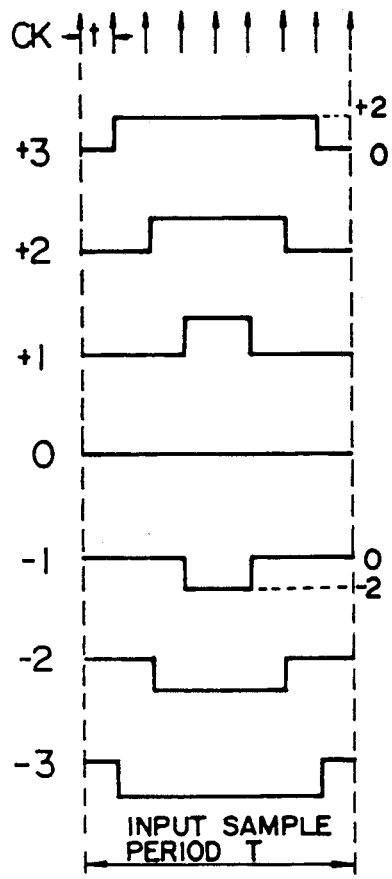
FIG. 8 shows the output waveforms from the PWM converter according to this invention.

The conversion output waveforms of the PWM converter of this embodiment become symmetrical relative to time as shown in FIG. 8.

The resolution ml obtained by the PWM converter shown in FIG. 2 is given by:

$$ml = T/t - 1 \quad (2)$$

The seven digital signal values from +3 to −3 can be obtained as shown in FIGS. 5 to 8.

Figure 9:
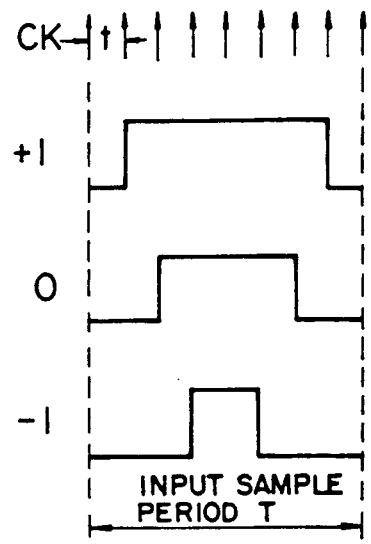
FIG. 9 shows the waveforms of the conventional PWM converter obtained at T/t=8.

The conversion output waveforms of a conventional PWM converter under the same conditions of this embodiment, i.e. T/t=8, are shown in FIG. 9 which indicates that only three digital signal values from +1 to −1 are obtained and so the conventional PWM converter has a resolution lower than that of this embodiment which can obtain seven values from −3 to +3.

Figure 1:
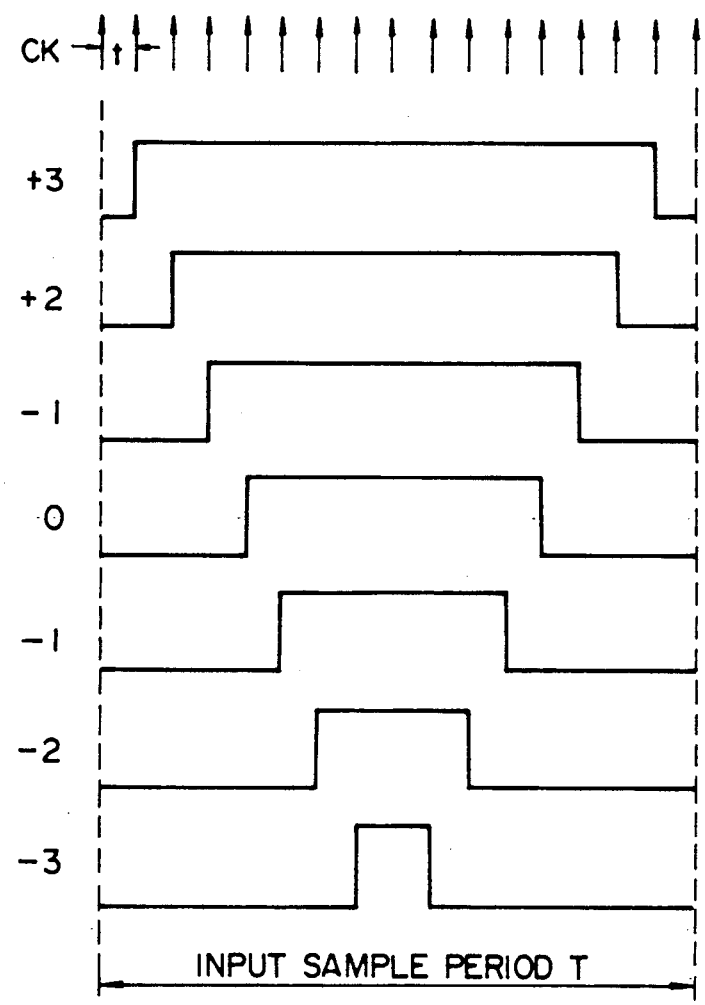
FIG. 1 shows PWM signals corresponding to seven input signal values according to the prior art.

Furthermore, the conversion outputs of the conventional PWM converter shown in FIG. 1 are obtained for T/t=16, whereas those of this embodiment shown in FIG. 8 are obtained for T/t=8. Therefore, with the same sample period and resolution of an input signal, a clock signal of two-fold frequency is required for the conventional PWM converter. With the same input sample period and the same clock signal frequency, the resolution of this embodiment can be improved by (two times +1) the conventional one.

According to the second embodiment of this invention shown in FIG. 3, a digital input signal applied to an input terminal 7 is converted by a first PWM converter 1 into a PWM signal A, and at the same time converted by a third PWM converter 3 into a PWM signal C. The PWM signals A and C are subtracted from each other at an analog subtracter 6 to output a PWM signal (A−C) or (C−A). Similar elements to those shown in FIG. 2 are represented by using identical numbers, so the description therefor is omitted. The PWM signal A is the same as that described with the first embodiment, so the description therefor is omitted.

Figure 10:
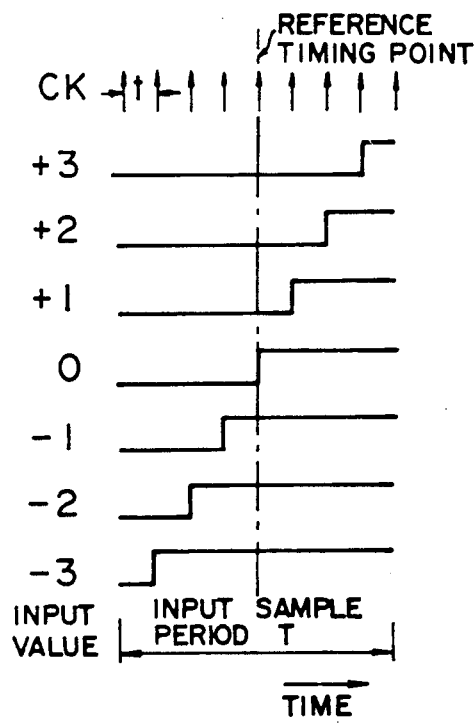
FIGS. 10 and 11 show the timings when the PWM signals are outputted, according to the second embodiment.

The PWM signal C is set so as to be outputted at the timings corresponding to the complementary values of the values of the odd numbered input signal, shown in FIG. 5 when the signals rise from a low level (L) to a high level (H) in synchronization with the clock signal CK. Namely at the later the timing, the larger the value of the odd numbered input signal relative to the odd numbered reference timing point. The complementary value is a symmetrical value relative to a reference value which is 0 in the case of a bipolar signal, namely, a value of opposite polarity. The timing for the input signal value +3, for example, therefore becomes the timing for the input signal value −3 shown in FIG. 5. The timings for the waveforms of the PWM signal C are as shown in FIG. 10 which correspond to the inversion of the waveforms shown in FIG. 6.

Figure 6:
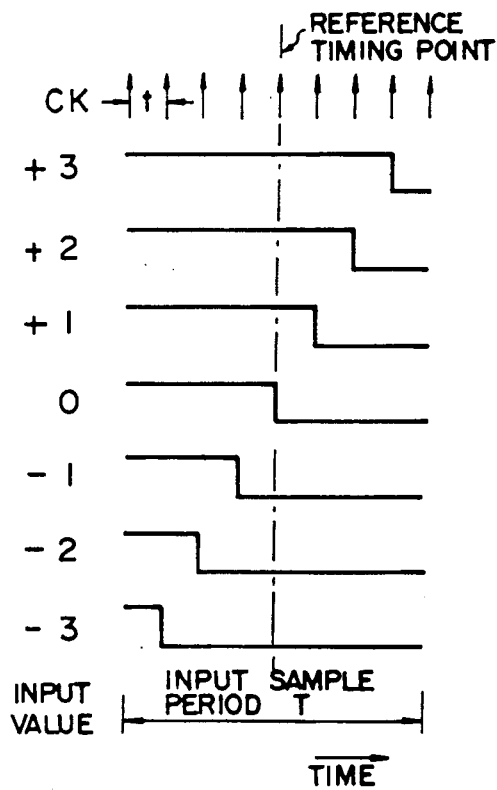
Figure 11:
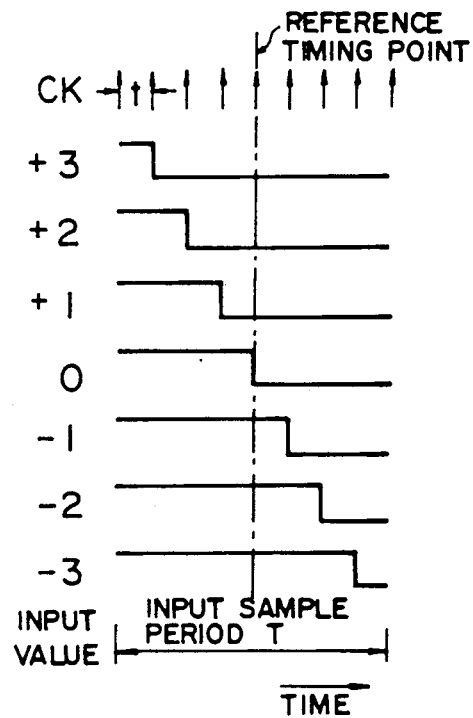
Figure 12:
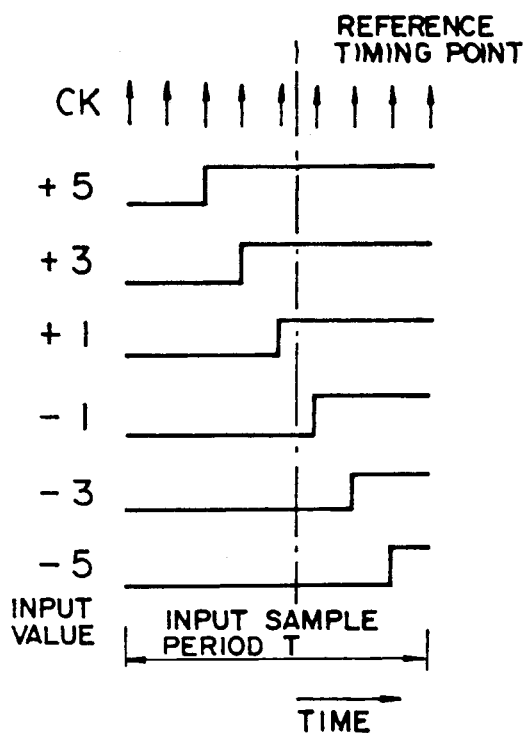
FIGS. 12 to 15 show the timings when the PWM signals are outputted, according to a modification of the first to third embodiments.
Figure 13:
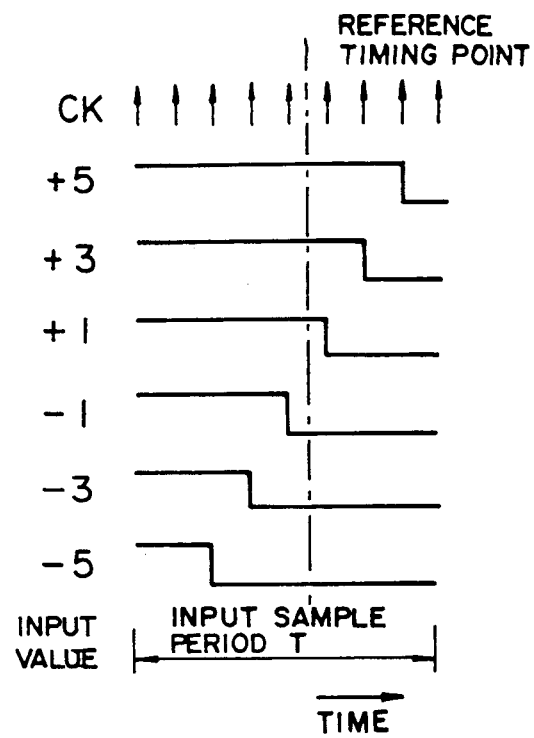
Figure 14:
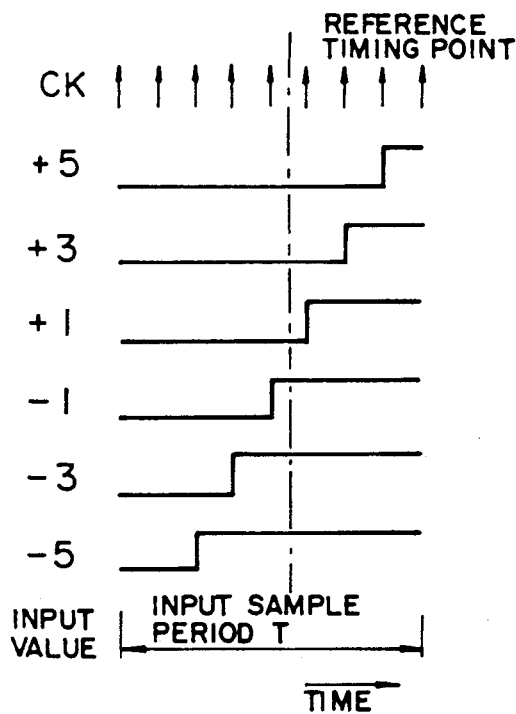
Figure 15:
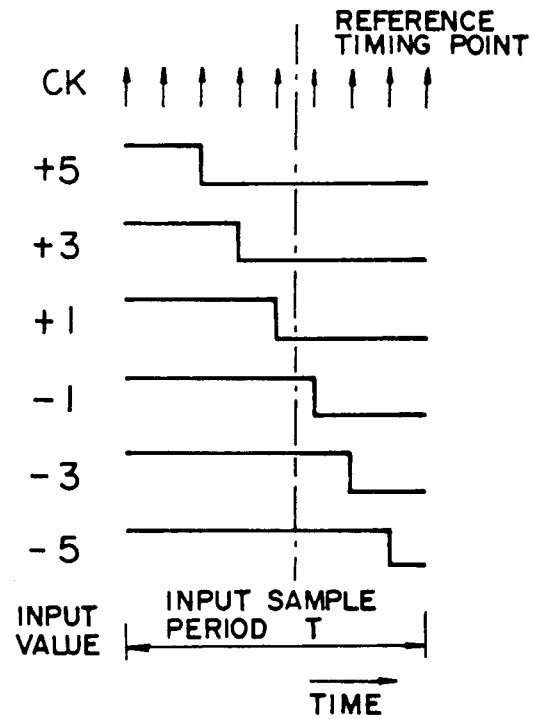

After the lapse of the predetermined period (input sample period), the PWM signal C is set so as to be outputted at the timings corresponding to the symmetrical reference values of the values of an input signal, shown in FIG. 6 when the signals fall from a high level (H) to a low level (L) in synchronization with the clock signal CK, namely at the earlier the timing the larger the value of the even numbered input signal relative to the even numbered reference timing point (for example, the timing for an input signal value +3 becomes the timing for the value −3 shown in FIG. 6. The timings for the waveforms of the PWM signal C are as shown in FIG. 11 which correspond to the inversion of the waveforms shown in FIG. 5). The pulse width from the rising point to the falling point of the PWM signal C is determined by the symmetrical reference values of the values of the odd numbered input signal and next even numbered input signal.

As described above, the PWM signal C is an inversion (C=B̄) of the PWM signal B of the PWM converter 2 described with the first embodiment.

In the third embodiment shown in FIG. 4, in place of the PWM converter 3 shown in FIG. 3, a second PWM converter 2 and an inverter 4 for inverting the output from the converter 2 are connected in tandem. The other circuit arrangement is the same as FIG. 3, and represented with identical numbers without giving the description therefor. The output signal B̄ of the inverter 4 is the same as the PWM signal C described previously. The structure shown in FIG. 4 is equivalent to the structure shown in FIG. 3. The difference signal (A−C) in FIGS. 3 and 4 obtained by subtracting the PWM signals A and C from each other is the same as the conversion output of the addition signal (A+B) of the analog adder 5 shown in FIG. 2, because C=B̄=−B. The output waveforms for the odd numbered input signal are shown in FIG. 7.

The timings for the PWM signal A for an even numbered input signal become the timings for the PWM signal B of the odd numbered input signal shown in FIG. 7, the timings for the PWM signal C become the inversion of the timings for the PWM signal A of an odd numbered input signal shown in FIG. 7, and the timings for the difference signal (A−C) are the same as the timings for the odd numbered input signal shown in FIG. 7.

The PWM converters shown in FIGS. 3 and 4 therefore obtain the same conversion outputs as from the PWM converter shown in FIG. 2.

When compared with the PWM converter shown in FIG. 2, the PWM converters shown in FIGS. 3 and 4 have the following advantage. Since there is a common mode rejection for signal components contained in the PWM signals A and C or PWM signals A and B applied to the analog subtracter 6, common mode power noises and PWM converter distortions can be suppressed.

In the above embodiments, the values of a digital input signal are assumed to take an integer including 0. The present invention is not limited to such values only, but other input values may be used. As an example of such values, a digital input signal taking only odd values will be described. The timings for the output waveforms of the first to third PWM converters in this case are shown in FIGS. 12 to 15. The ratio T/t=8 is the same as above, and six input values −5, −3, −1, +1, +3, and +5 are used. The resolution is of 6 values and the step size is 2. The timings shown in FIGS. 12 to 15 may be used for the six input values −2.5, −1.5, −0.5, +0.5, +1.5 and +2.5 with the step size 1. In the case of the input values not inclusive of 0, the previously given description also applies by using FIG. 12 for FIG. 5, FIG. 13 for FIG. 6, FIG. 14 for FIG. 10, and FIG. 15 for FIG. 11, so the description will not be duplicated.

As appreciated from the foregoing description, in the case of a bipolar input signal, the output reference timing point is the timing when an output for an input signal value 0 from each PWM converter rises or falls. In the case where the digital input signal value takes only an odd number, the output reference timing point is set at the control point between two clock timing points when the outputs for the input values +1 and −1 change, as shown in FIGS. 12 to 15.

The outputs of each PWM converter for the odd and even numbered input signals described above are summarized in Table 1.

TABLE 1

| Input Signal | Odd Numbered | Even Numbered |
|---|---|---|
| Output Reference Timing Point | Odd Numbered | Even Numbered |
| Output A of 1st PWM converter | Rise as shown in FIG. 5 (FIG. 12) | Fall as shown in FIG. 6 (FIG. 13) |
| Output B of 2nd PWM converter | Fall as shown in FIG. 6 (FIG. 13) | Rise as shown in FIG. 5 (FIG. 12) |
| Output of C=B̄ of 3rd PWM converter | Rise as shown in FIG. 10 (FIG. 14) | Fall as shown in FIG. 11 (FIG. 15) |

In the above first to third embodiments, the timing points when the PWM signals A to C rise or fall are limited within the one period of the input sample period.

In the following, the embodiment when such timing points are present over one input sample period, will be described.

Figure 16:
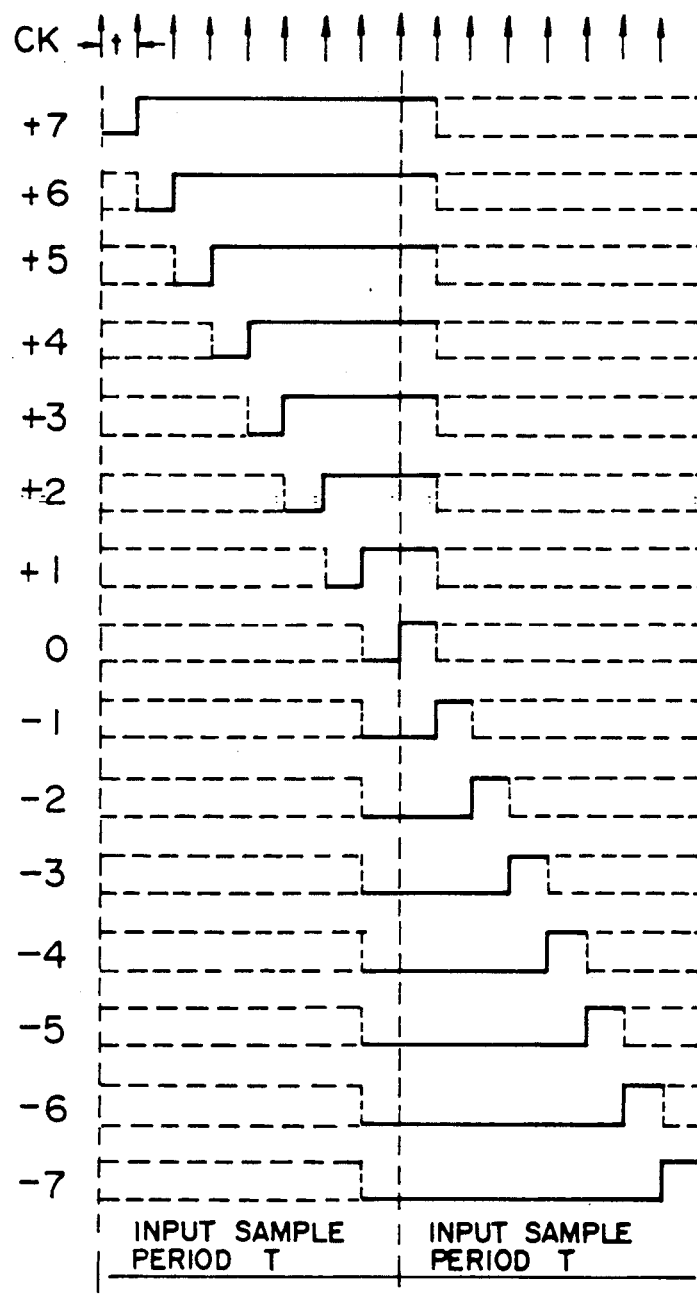
FIGS. 16 and 17 show the timings when the PWM signals are outputted at timing points over one input sample period, according to the present invention.
Figure 17:
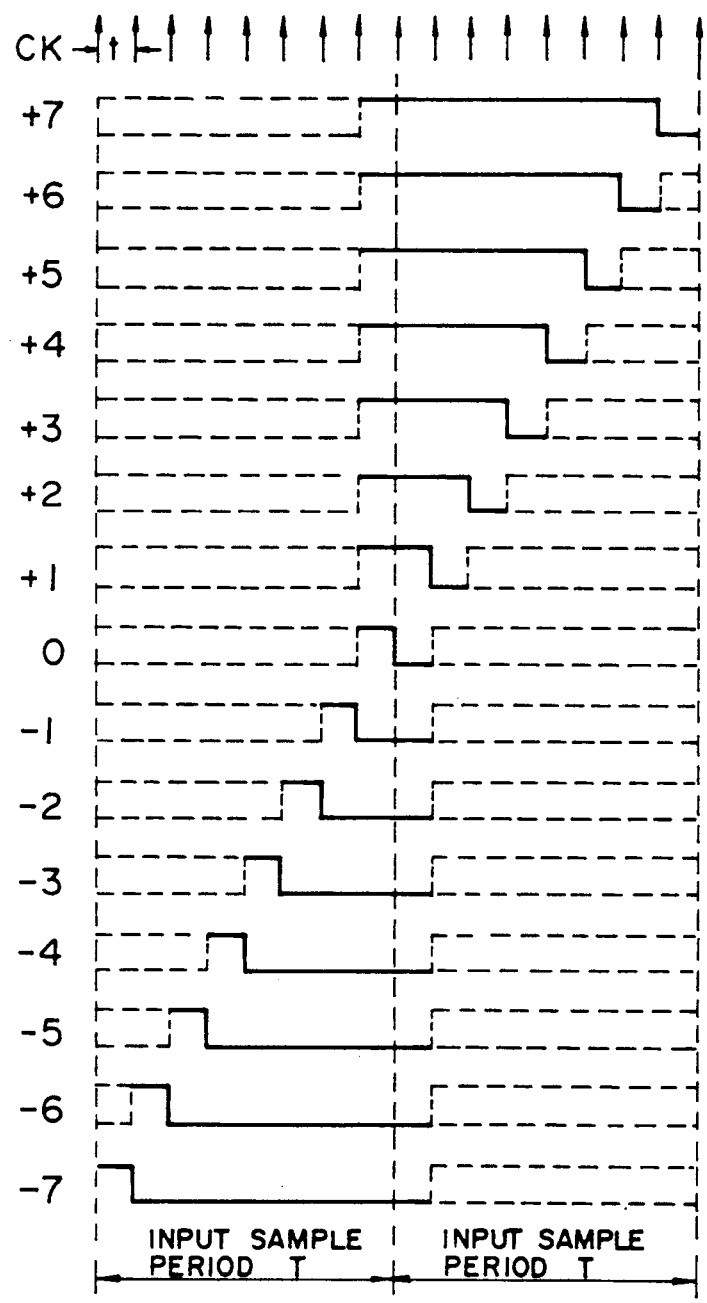

(A) By setting the timing point when the PWM signals A and B rise or fall over the range in excess of the one input sample period T, or (B) by setting the timing point when the PWM signals A and C rise or fall over the range in excess of the one input sample period T, the output timings for PWM signals A, B, B̄, and C become, for example, as shown in FIGS. 16 and 17, allowing conversion outputs for input signals having fifteen values from +7 to −7.

The foregoing description previously given to FIG. 2 (first embodiment) and FIGS. 3 and 4 (second and third embodiments) also applies by using FIG. 16 for FIG. 5, and FIG. 17 for FIG. 6, respectively for the cases (A) and (B).

FIGS. 16 and 17 show the case where the PWM signals fall or rise at the timings over a period 2T.

The broken line portions in FIGS. 16 and 17 indicate the range which is affected by the value of an input signal one signal before or after.

The same conversion output A+B (=A−C) is obtained for the embodiments shown in FIG. 2 and FIGS. 3 and 4. Similarly, the cases (A) and (B) also obtain the same conversion output.

Representing the time duration between two set timing points by T+2(n−1)×t where n is a natural number, the resolution m3 is given by:

$$m3 = T/t - 1 + 2n \qquad (3)$$

In the case of FIGS. 16 and 17, a digital input signal having the fifteen values from +7 to −7 can be used. The resolution of this case is improved by (two times +1) that shown in FIGS. 5 and 6, under the same input sample period T and clock signal period t.

However, if the absolute value S of sum of the values of two consecutive input signals exceeds (T/t−1), the rise timing point and fall timing point are superposed one upon another so that the correct conversion is not possible.

In the case of FIGS. 16 and 17, the superposition occurs if the absolute value S exceeds 7 (larger than or equal to 8). Therefore, the cases (A) and (B) can obtain a better resolution for input signals satisfying the conditions that S is equal to or smaller than (T/t−1), namely, S is equal to or smaller than m1.

An example of an input signal which can effectively use such conditions is an input signal subjected to higher order noise shaping for bit compression.

Figure 18:
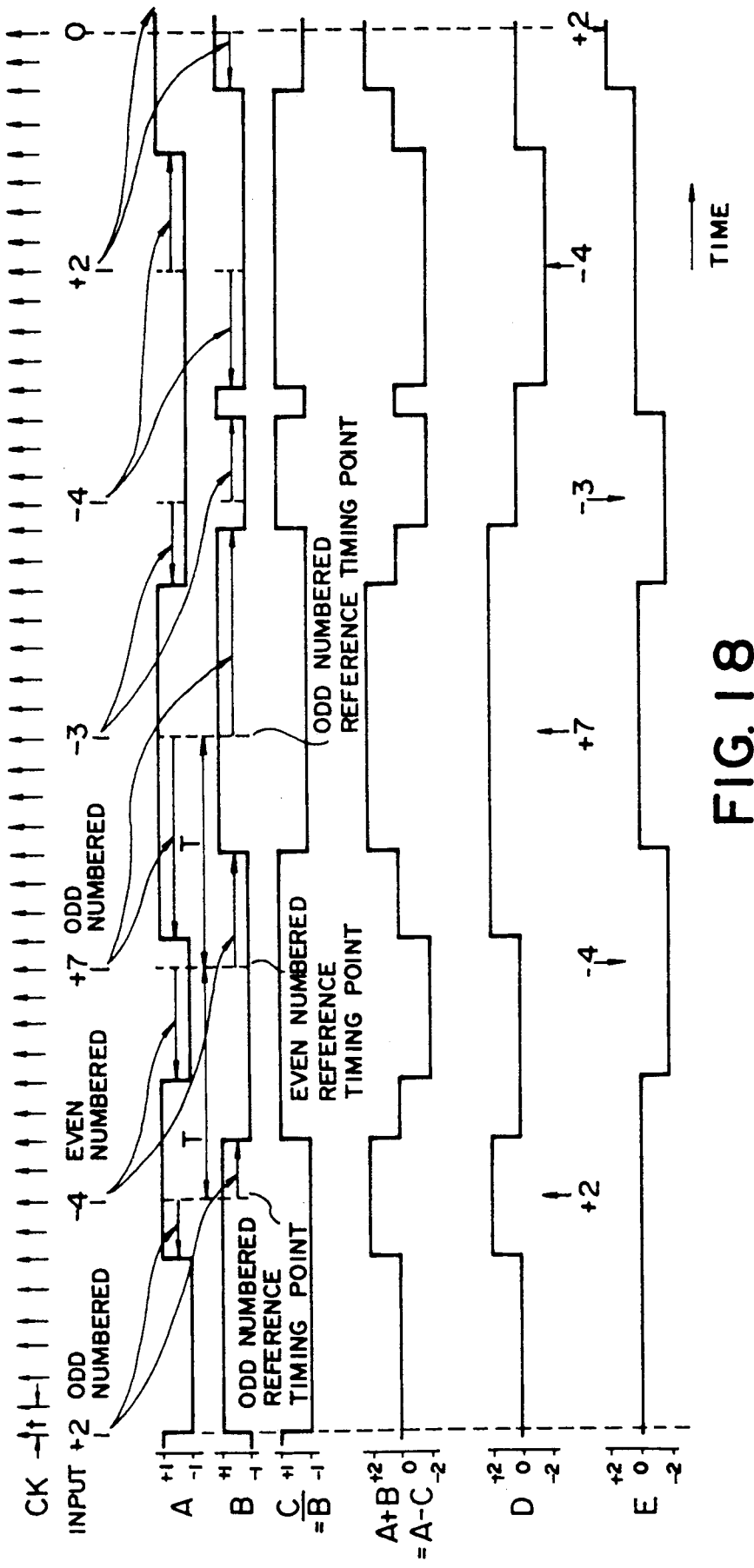
FIG. 18 shows an example of output waveforms from the PWM converter according to this invention.

An example of output waveforms for the cases (A) and (B) is shown in FIG. 18 wherein the input signal value changes in the order of +2, −4, +7, −3, −4, +2, 0, . . . .

The waveforms (A+B) or (A−C) at the output terminal 8 shown in FIG. 18 seem to be asymmetrical with respect to time because of the superposition of symmetrical waveforms. In FIG. 18, signal D represents the conversion result for the odd numbered input signals, and signal E represents the conversion result for even numbered input signals. Both the signals D and E are symmetrical with respect to time. The sum of signals D and E is the same as the waveforms of (A+B)=(A−C). The signal at the output terminal 8 can be considered to be composite of the symmetrical signals D and E so that phase error is not produced.

Figure 19:
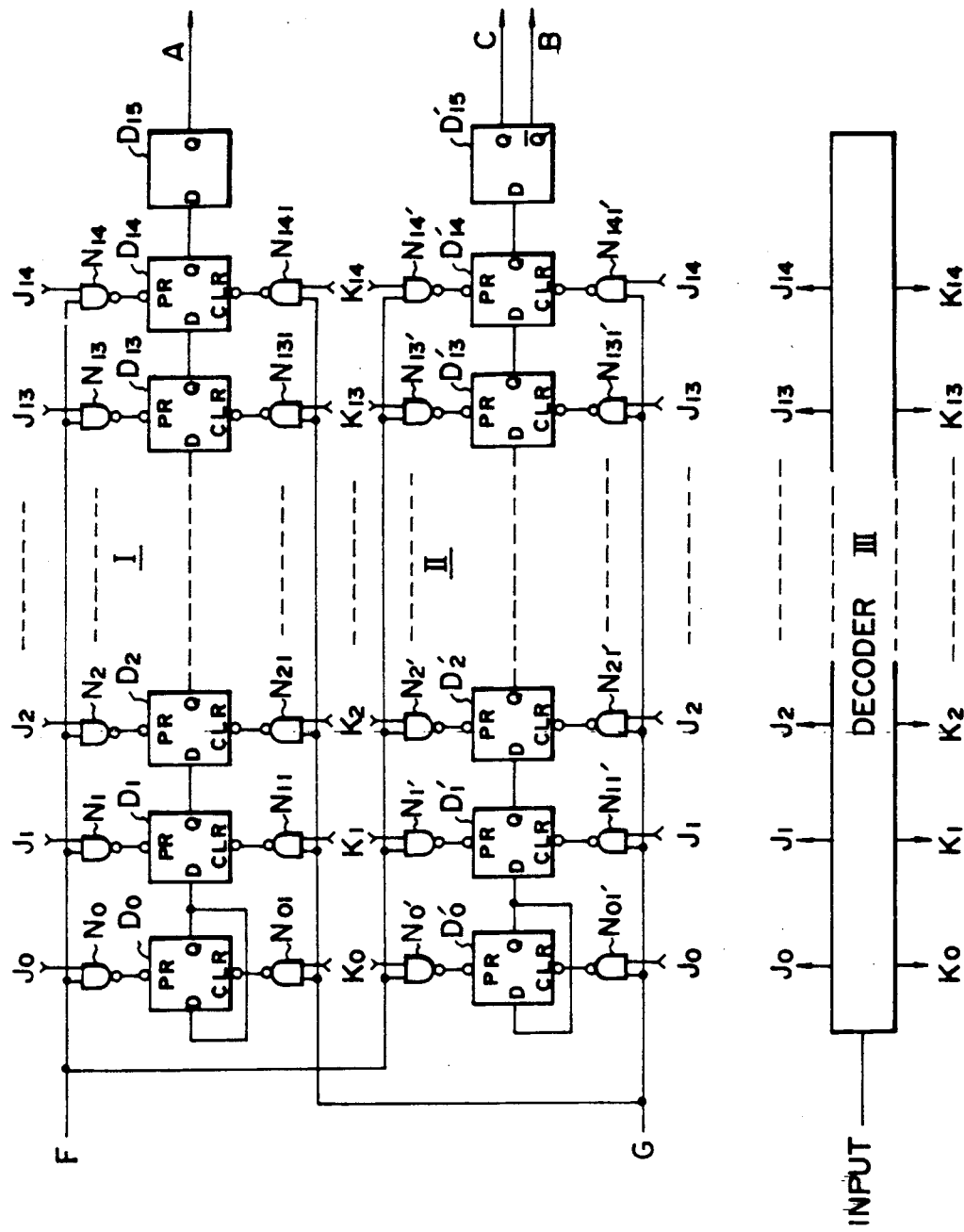
FIG. 19 is a circuit diagram showing the first to third PWM converters.
Figure 20:
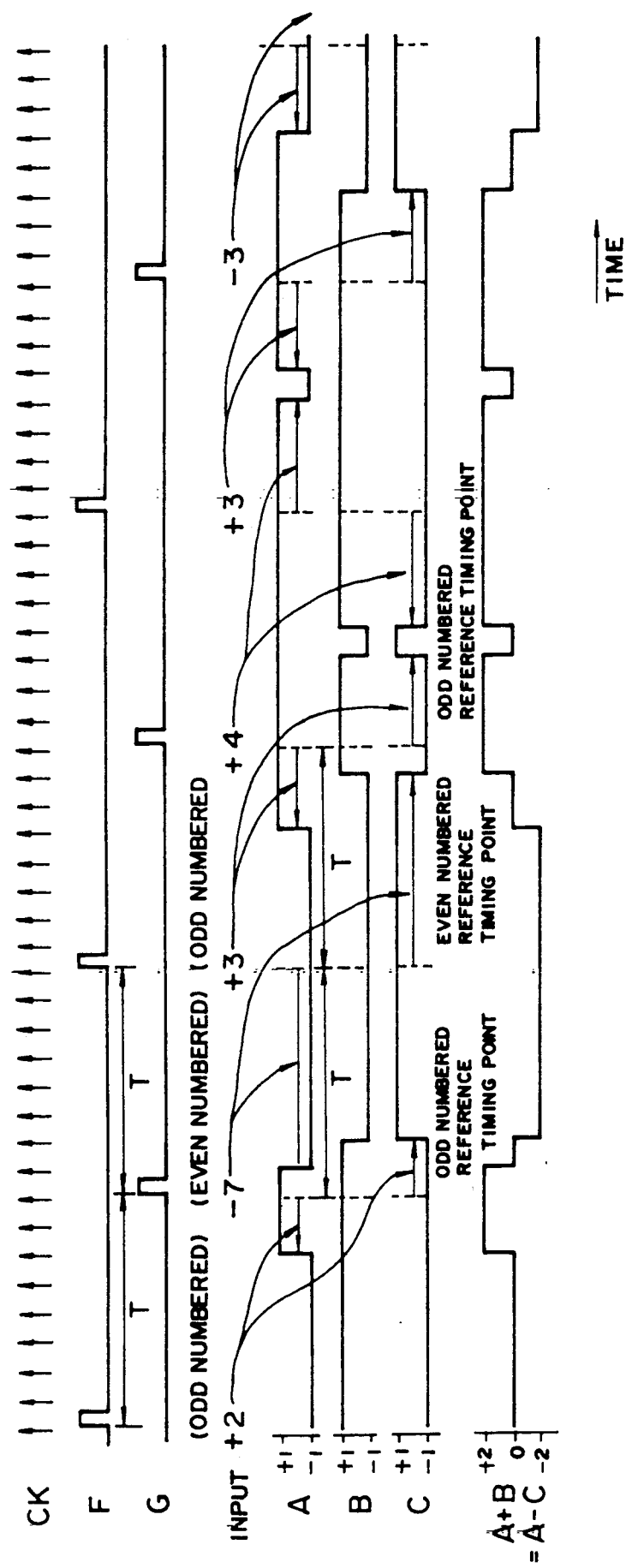
FIG. 20 shows another example of output waveforms from the PWM converter according to this invention.

FIG. 19 is a circuit diagram showing the first to third PWM converters, and FIG. 20 shows the timings when the PWM waveforms are outputted from the PWM converters shown in FIG. 19.

As shown in FIG. 19, sixteen D-type flip-flops (hereinafter abbreviated as DFF) D0 to D15 are connected in tandem each being supplied with a clock CK shown in FIG. 20 (although the clock is omitted in FIG. 19), to thereby realize a shift register I. Similarly, sixteen DDF D'0 to D'15 are connected in tandem to form a shift register II.

A decoder III is supplied with a digital input signal. The supplied digital input signal is converted into fifteen outputs J0 to J14 (=J) and fifteen outputs K0 to K14 (=K) having the output values as shown in Tables 2 and 3. Table 2 is a J-output conversion table for the decoder III, and Table 3 is a K-output conversion table for the decoder III. In Tables 2 and 3, "1" represents a high level (H) and "0" represents a low level (L).

Signals F and G shown in FIG. 19 are data set timing pulse signals supplied to the DFF D0 to D15 and D'0 to D'15 of the shift registers I and II, respectively, and are generated by a timing generation circuit (not shown). The signal F takes a high level during about half the period of the clock CK at the timing indicated at F in FIG. 20 after the outputs J0 to J14 and K0 to K14 from the decoder III for the odd numbered input signal supplied to the decoder III have been established and before the even numbered input signal is supplied. The signal G takes a high level during about half the period of the clock CK at the timing indicated at G in FIG. 20 after the outputs J0 to J14 and K0 to K14 from the decoder III for the even numbered input signal supplied to the decoder III have been established, namely, at the timing delayed from the signal F by the time corresponding to the input sample period T.

NAND circuits N0 to N14 and N'0 to N'14 connected to the preset terminals ($\overline{PR}$) of DFF D0 to D15 and D'0 to D'15 gate the outputs J0 to J14 and K0 to K14 from the decoder III with the signal F. In other words, only the high level portions of the outputs J0 to J14 and K0 to K14 of the decoder III preset corresponding flip-flop.

With the above operation, the rise timings from the low level to the high level of the outputs A and C (indicated at A and C in FIGS. 19 and 20) of the PWM converters are set.

NAND circuits N01 to N141 and N'01 to N'141 connected to the clear terminals ($\overline{CLR}$) of the DFF D0 to D15 and D'0 to D'15 gate the outputs J0 to J14 and K0 to K14 from the decoder III with the signal G. In other words, only the high level portions of the outputs J0 to J14 and K0 to K14 of the decoder III clear (reset) corresponding flip-flops.

With the above operation, the fall timings from the high level to the low level of the outputs A and C of the PWM converters are set.

The first PWM converter described previously is constructed of the shift register I composed of DFF D0 to D15, NAND circuits N0 to N14 and N01 to N141, and decoder III, the output of which is the Q output of the DFF D15 (indicated at A in FIGS. 19 and 20). The second PWM converter described previously is constructed of the shift register II composed of DFF D'0 to D'15, NAND circuits N'0 to N'14 and N'01 to N'141, and decoder III, the output of which is the $\overline{Q}$ output of the DFF D'15 (indicated at B in FIGS. 19 and 20). The third PWM converter described previously shares the arrangement of the second PWM converter, the output of which is the Q output of the DFF D'15 (indicated at C in FIGS. 19 and 20).

Consequently, the arrangement of the PWM converter shown in FIG. 2 can be realized by adding the Q output (A) of D15 and $\overline{Q}$ output (B) of D'15 by an analog adder. The arrangement of the PWM converter shown in FIG. 3. can be realized by subtracting the Q output (C) of D'15 from the Q output (A) of D15 by an analog subtracter. The arrangement of the PWM converter shown in FIG. 4 can be realized by subtracting the $\overline{Q}$ output (B) of D'15 inverted by an inverter from the Q output (A) of D15 from each other at an analog subtracter. In this case, the inverter output ($\overline{B}$) and the Q output (C) of D'15 are the same, and the arrangement shown in FIG. 4 is the same as that shown in FIG. 3.

The invention has been described assuming that the ratio T/t is 8 and the input signal is a bipolar signal. The invention is not limited thereto, but various changes and modifications are possible. For example, the analog adder 5 and analog subtracter 6 may use those devices containing integration elements.

What is claimed is:

1. A PWM type D/A converter wherein digital input signals supplied to the converter at each predetermined input sample period are designated as odd and even numbered input signals alternately in the order of input, the reference timing point for outputting an odd numbered input signal is designated as an odd numbered reference timing point, and the reference timing point for outputting an even number is designated as an even numbered reference timing point, said PWM type D/A converter comprising:

a first PWM converter receiving said digital input signal for outputting an output signal (A) wherein the timing point when said output signal (A) rises from the low level to the high level is set at the earlier the timing, the larger the value of the odd numbered input signal relative to the odd numbered reference timing point, and the timing point when said output signal (A) falls from the high level to the low level is set at the later the timing, the larger the value of the even numbered input signal relative to the even numbered reference timing point, and wherein the pulse width from the rising point to the falling point of said output signal (A) is determined by the values of the odd numbered input signal and the next even numbered input signal;

a second PWM converter receiving said digital input signal for outputting an output signal (B) wherein the timing point when said output signal (B) falls from the high level to the low level is set at the later the timing, the larger the value of the odd numbered input signal relative to the odd numbered reference timing point, and the timing when said output signal (B) rises from the low level to the high level is set at the earlier the timing, the larger the value of the even numbered input signal relative to the even numbered reference timing point, and wherein the pulse width from the rising point to the falling point of said output signal (B) is determined by the values of the even numbered input signal and the next odd numbered input signal; and an analog adder for adding together said output signal (A) from said first PWM converter and said output signal (B) from said second PWM converter to output a sum signal (A+B);

wherein an analog signal corresponding to said digital input signal is outputted from said analog adder.

2. A PWM type D/A converter wherein digital input signals supplied to the converter at each predetermined input sample period are designated as odd and even numbered input signals alternately in the order of input, the reference timing point for outputting an odd numbered input signal is designated as an odd numbered reference timing point, and the reference timing point for outputting an even number is designated as an even numbered reference timing point, said PWM type D/A converter comprising:

a first PWM converter receiving said digital input signal for outputting an output signal (A) wherein the timing point when said output signal (A) rises from the low level to the high level is set at the earlier the timing, the larger the value of the odd numbered input signal relative to the odd numbered reference timing point, and the timing point when said output signal (A) falls from the high level to the low level is set at the later the timing, the larger the value of the even numbered input signal relative to the even numbered reference timing point, and wherein the pulse width from the rising point to the falling point of said output signal (A) is determined by the values of the odd numbered input signal and the next even numbered input signal;

a second PWM converter receiving said digital input signal for outputting an output signal (C) wherein the timing point when said output signal (C) rises from the low level to the high level is set at the later the timing, the larger the value of the odd numbered input signal relative to the odd numbered reference timing point, and the timing when said output signal (C) falls from the high level to the low level is set at the earlier the timing, the larger the value of the even numbered input signal relative to the even numbered reference timing point, and wherein the pulse width from the rising point to the falling point of said output signal (C) is determined by a complementary values of the values of the odd numbered input signal and the next even numbered input signal; and an analog subtracter for subtracting from each other said output signal (A) from said first PWM converter and said output signal (C) from said second PWM converter to output a difference signal (A−C) or (C−A);

wherein an analog signal corresponding to said digital input signal is outputted from said analog subtracter.

* * * * *